United States Patent [19]

Kang

[11] Patent Number: 5,679,592
[45] Date of Patent: Oct. 21, 1997

[54] PROCESS FOR FORMATION OF LDD MOSFET WING PHOTORESIST

[75] Inventor: Ho-Young Kang, Kyeungsangbuk-do, Rep. of Korea

[73] Assignee: LG Semicon Co., Ltd., Cheongju, Rep. of Korea

[21] Appl. No.: 573,713

[22] Filed: Dec. 18, 1995

[30] Foreign Application Priority Data

Dec. 16, 1994 [KR] Rep. of Korea .................. 94-34592

[51] Int. Cl.[6] ............................................ H01C 21/265
[52] U.S. Cl. ............................ 437/44; 437/41; 437/229
[58] Field of Search ........................ 437/44, 229, 41

[56] References Cited

U.S. PATENT DOCUMENTS 5,032,530  7/1991  Lowrey et al. ......................... 437/34
5,364,807  11/1994  Hwang .................................... 437/44
5,395,781  3/1995  Wilhoit .................................... 437/44

Primary Examiner—John Niebling
Assistant Examiner—Richard A. Booth
Attorney, Agent, or Firm—Loudermilk & Associates

[57] ABSTRACT

A process for forming a MOSFET, which includes the steps of: forming a gate insulating layer and a gate electrode on a semiconductor substrate, and forming lightly doped impurity regions on the left and right sides of the gate electrode and on the substrate; spreading photoresist, and forming a photoresist pattern for defining a side wall spacer formation portion on the gate electrode and on sides of the gate electrode; depositing an insulating layer on the surface of the substrate, and etching the insulating layer to remove an exposed surface portion and to form a side wall spacer on sides of the gate electrode; and removing the photoresist pattern, and forming a heavily doped source/drain region on the gate electrode and on sides of the side wall.

20 Claims, 3 Drawing Sheets

PROCESS FOR FORMATION OF LDD MOSFET WING PHOTORESIST

FIELD OF THE INVENTION

The present invention relates to processes for forming MOSFETs, and more particularly to processes for forming MOSFETs having LDD-type (lightly doped drain) source and drain regions.

BACKGROUND OF THE INVENTION

Generally in semiconductor integrated circuits, in order to increase the density, the dimensions of MOS transistors are reduced. To this end, a junction is formed by carrying out one round of a simple ion implantation, and, because of this, a short channel effect is produced. In order to improve this short channel effect, a transistor having an LDD junction is formed utilizing a side wall structure.

That is, conventionally, a gate of the transistor is formed, and an LDD ion implantation is carried out. An insulating layer is deposited, and a side wall is formed on a gate side wall by carrying out a blank etch-back method. A source/drain region then is ion-implanted.

FIGS. 1A–1C illustrate the above-described conventional technique, and will be described in further detail.

As illustrated in FIG. 1A, gate oxide layer 13 is formed on the surface of a substrate, and polysilicon gate 14 is formed. On the substrate on which gate 14 is formed, lightly doped junction region 12 is formed around the gate by carrying out a first ion implantation.

As illustrated in FIG. 1B, insulating layer 16, which is a CVD oxide layer, is deposited for forming a side wall. As illustrated in FIG. 1C, a plasma dry etching method is carried out to anisotropically etch the insulating layer to form side wall spacer 16' around the gate. During the anisotropic etching for forming the side wall, however, loss or damage occurs on the top of the gate (portion A in FIG. 1C) and in the junction regions (portion B in FIG. 1C) of the substrate. Therefore, an additional process has to be carried out to remove the damaged portion.

After this additional process, a second ion implantation is carried out to form a heavily doped region on the substrate on which the side wall has been formed. As a result, a source/drain region of the transistor is formed, which includes lightly doped regions 12 and heavily doped regions 17, thereby completing the transistor.

This conventional technique, however, has the following problems. During the anisotropic etching for forming the side wall, loss or damage occurs in the junction regions and the gate.

In order to remove the damaged portion, an additional etching and annealing process have to be carried out, thereby complicating the manufacturing process. Further, with this process, it is not easy to adjust the critical dimensions (CD) in relation to the side wall thickness and etching conditions.

SUMMARY OF THE INVENTION

The present invention is intended to overcome the above-described disadvantages of the conventional technique.

Therefore, it is an object of the present invention to provide a process for forming a MOSFET, in which a side wall is formed utilizing photoresist, so that the side wall forming process may be simple, and loss of the gate polysilicon and damage of the junction regions can be prevented, and adjustment of critical dimensions may be arbitrarily carried out in accordance with the characteristics of the product.

In achieving the above object, a process for forming a MOS transistor according to the present invention includes the steps of: forming a gate insulating layer and a gate electrode on a semiconductor substrate, and forming lightly doped impurity regions on the left and right sides of the gate electrode in the substrate; spreading photoresist, and forming a photoresist pattern for defining a side wall spacer formation portion on the gate electrode and on sides of the gate electrode; depositing an insulating layer on the whole surface of the substrate, and etching the insulating layer to remove an exposed surface portion and to form a side wall spacer on sides of the gate electrode; and removing the photoresist pattern, and forming a heavily doped source/drain region in the substrate on sides of the side wall.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1A:
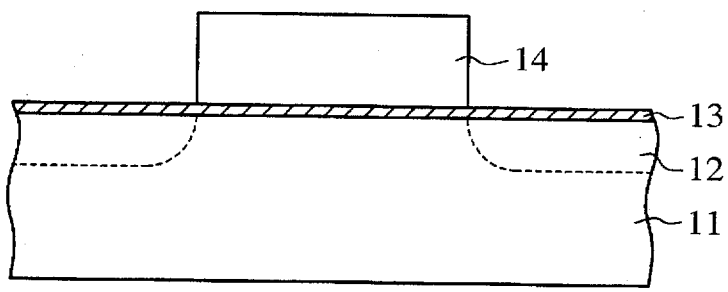
FIGS. 1A to 1C illustrate the conventional technique.
Figure 1B:
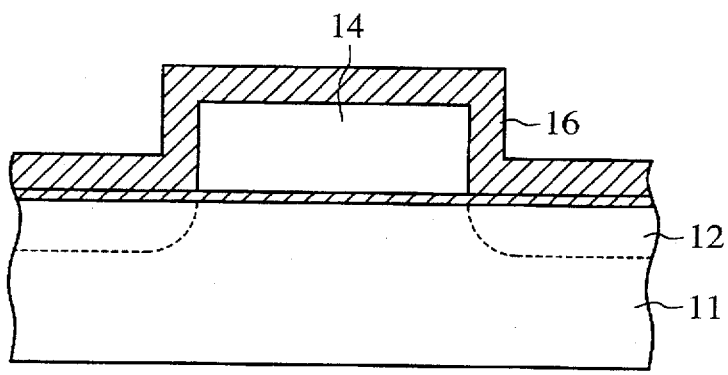
Figure 1C:
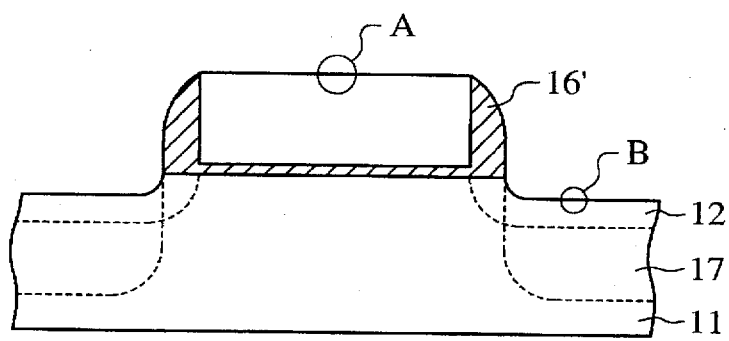
Figure 2A:
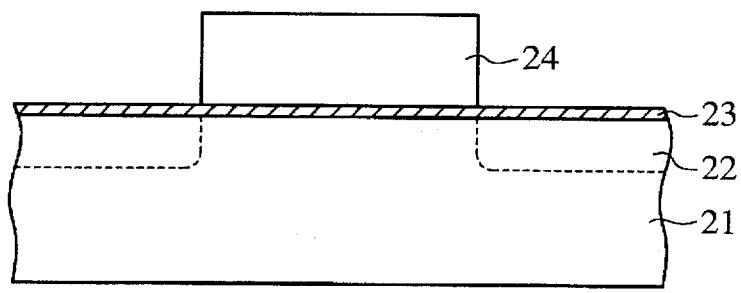
FIGS. 2A to 2C illustrate a first embodiment of the present invention.
Figure 2B:
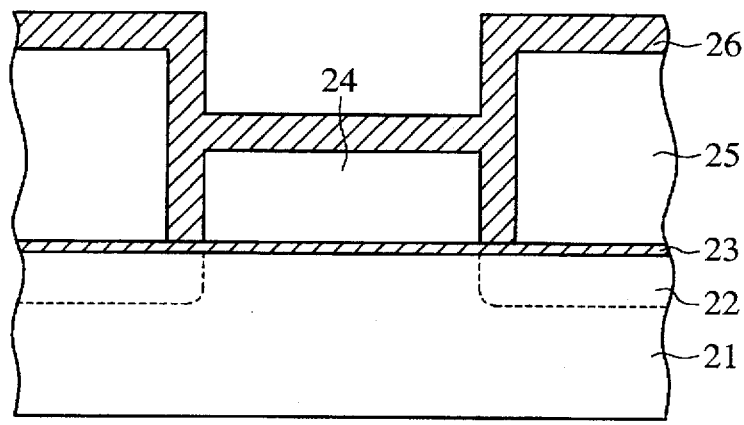
Figure 2C:
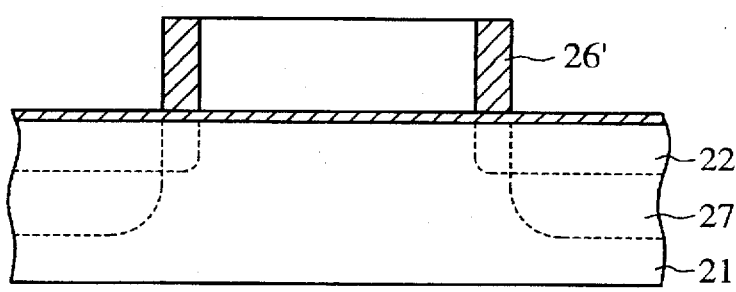

FIGS. 2A–2C are sectional views illustrating a process for forming an MOS transistor of a semiconductor device according to a first embodiment of the present invention.

First, as illustrated in FIG. 2A, by applying a general transistor manufacturing process, gate oxide layer 23 is formed upon semiconductor substrate 21, and polysilicon is deposited and patterned to form gate 24. A first ion implantation is carried out to form lightly doped regions 22 on the sides of the gate.

As illustrated in FIG. 2B, a side wall is formed as follows. Photoresist is spread using positive or negative photoresist, and an exposure and a development are carried out. Thus, the portion of the photoresist for the region on which a gate and a gate side wall are to be formed is removed, thereby forming photoresist pattern 25. Thus, the gate side wall region which is defined by the photoresist pattern is made to be symmetrical relative to the gate.

Insulating layer 26 is spread on the whole surface. Insulating layer 26 is formed by applying a low temperature chemical vapor deposition method at a temperature of below about 150° Celsius.

Insulating layer 26 is formed evenly on the top of the gate, on the top of the photoresist pattern, and on a region between the photoresist pattern and the gate.

As illustrated in FIG. 2C, the insulating layer which is exposed to the surface is removed by applying a wet etching method using a fluoride solution, so that the remaining portions of the insulating layer form side walls 26'. Here, the fluoride solution may be a buffered fluoric acid (buffered HF).

The photoresist is removed and a cleaning is carried out using a chemical which is capable of removing polymers. The major ingredient of the photoresist is a polymer, and, therefore, any suitable chemical which is capable of removing organic materials may be used. Particularly, an SPM (sulfured peroxide mixture) may be used, which is prepared with a mixture of $H_2SO_2$ and $H_2O_2$ or a mixture of $H_2SO_4$, and $O_2$.

By removing the photoresist, side walls 26' are completed, which in this embodiment are disposed symmetrically around the gate. Then, a second ion implantation is carried out to form heavily doped impurity regions 27. In this way, a source/drain region for the transistor is completed, thereby completing the manufacturing of the transistor.

Figure 3A:
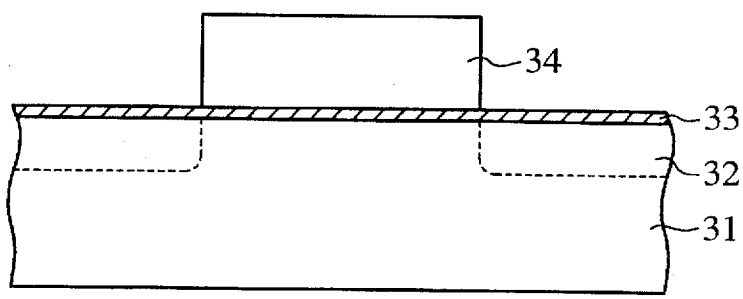
FIGS. 3A to 3C illustrate a second embodiment of the present invention.
Figure 3B:
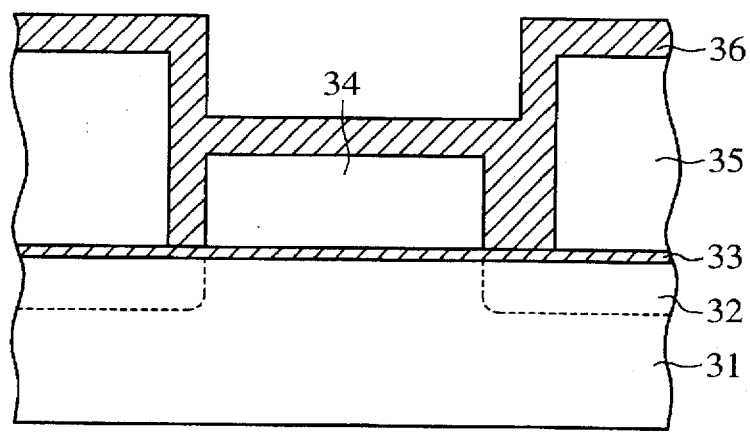
Figure 3C:
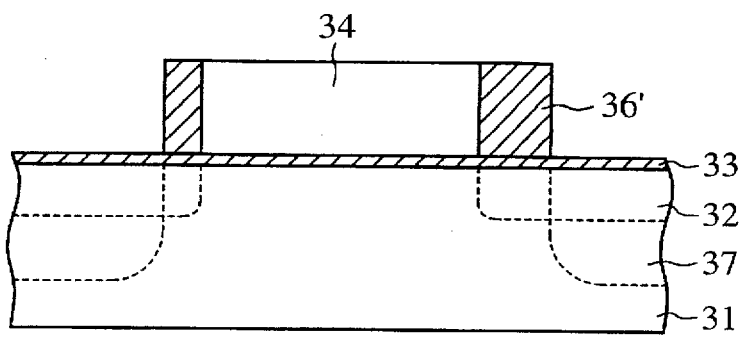

FIGS. 3A to 3C illustrate another embodiment of a process according to the present invention. As illustrated, gate oxide layer 33 and gate electrode 34 are formed on semiconductor substrate 31, and lightly doped region 32 is formed by carrying out an ion implantation. Thereafter, pattern 35 is formed of photoresist, and thus a spacer of side wall 36', which is defined by the photoresist, is formed asymmetrically relative to the gate.

Therefore, an LDD structure of this embodiment is formed asymmetrically around the gate. That is, by adjusting the photoresist pattern, the lightly doped source/drain region can be adjusted asymmetrically depending on the particular need. This embodiment will be described in further detail.

First, as illustrated in FIG. 3A, gate oxide layer 33 is formed on semiconductor substrate 31, and polysilicon is deposited and patterned to form gate 34. A first ion implantation is carried out to form lightly doped region 32 on a portion of the substrate which will be positioned under the side wall of the gate.

As illustrated in FIG. 3B, photoresist is spread, and an exposure and a development are carried out. Thus, a portion of the photoresist for a spacer for the gate and gate side wall is removed, thereby forming photoresist pattern 35. Under this condition, for this embodiment, the spacer on one side of the gate is made to be larger than the spacer on the other side of the gate, so that the gate side wall region defined by the photoresist pattern may not be symmetrical relative to the gate, or the gate side wall region is formed only on one side of the gate, so that the side wall region would be asymmetrical.

Insulating layer 36 is formed by applying a low temperature chemical vapor deposition method at a temperature of below about 150° Celsius. This insulating layer may be composed of an oxide or a nitride. This insulating layer is formed evenly on the top of the gate, on the top of the photoresist pattern, and in the region between the photoresist pattern and the gate.

As illustrated in FIG. 3C, the insulating layer which is exposed to the surface is removed by applying a wet etching method using a fluoride solution, so that only the portion of the insulating layer for side wall 36' would remain. Here, the fluoride solution may be a buffered fluoric acid (buffer HF), and the time is adjusted so that a portion of the insulating layer corresponding to the side wall portion would not be removed, as with the first embodiment.

The photoresist is removed and a cleaning is carried out using a chemical which is capable of removing polymers. Again, the major ingredient of the photoresist is a polymer, and, therefore, any suitable chemical which is capable of removing organic materials may be used. Particularly, there may be used an SPM (sulfured peroxide mixture) which is prepared with a mixture of $H_2SO_4$ and $H_2O_2$ or a mixture of $H_2SO_4$ and $O_2$. With the photoresist removed, a spacer of side wall 36' is formed around the gate in an asymmetrical form. A second ion implantation is carried out to form heavily doped impurity region 37.

In this way, a source/drain region for the transistor is completed, thereby completing the manufacturing of the transistor.

According to the present invention, the following effects are obtained. During the formation of the side wall, an anisotropic etching process is not carried out, and, therefore, damage does not occur on the gate and in the junction region as with the conventional method. Therefore an etching and annealing for removing the damaged portions may be skipped, and, therefore, the process may be simplified.

Further, compared with the conventional general method in which the thickness of the insulating layer of the side wall and the anisotropic conditions are adjusted, the present invention may carry out the side wall CD adjustment in an arbitrary manner in accordance with the desired characteristics of the products. Particularly, depending on the need in view of the product characteristics, an asymmetrical side wall (or asymmetrical LDD) may be formed.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming an MOS transistor, comprising the steps of:

forming a gate insulating layer and a gate electrode on a semiconductor substrate, and forming lightly doped impurity regions on left and right sides of the gate electrode in the substrate;

applying photoresist, and patterning the photoresist to form an open portion at the sides of the gate electrode, wherein the photoresist is removed from the open portion;

depositing and etching an insulating layer, wherein an exposed surface portion of the insulating layer is etched, wherein a side wall spacer is formed at the sides of the gate electrode in the open portion; and removing the photoresist pattern, and forming a heavily doped source/drain region in the substrate beside the side wall spacer of the gate electrode.

2. The process of claim 1, wherein the insulating layer comprises an oxide layer formed by applying a low temperature chemical vapor deposition method.

3. The process of claim 2, wherein the oxide layer is formed by maintaining a process temperature below about 150° Celsius.

4. The process of claim 1, wherein the insulating layer is etched by applying a wet etching method.

5. The process of claim 4, wherein, in carrying out the wet etching method, a fluoride solution is used.

6. The process of claim 5, wherein the fluoride solution is a buffered HF acid.

7. The process of claim 1, wherein, the photoresist is patterned using a chemical capable of removing organic materials.

8. The process of claim 7, wherein the chemical capable of removing organic materials comprises a mixture of $H_2SO_4$ and $H_2O_2$.

9. The process of claim 1, wherein the side wall spacer is symmetrical relative to the gate electrode.

10. The process of claim 1, wherein the side wall spacer is asymmetrical relative to the gate electrode.

11. A process for forming an MOS transistor, comprising the steps of:

forming a gate insulating layer and a gate electrode on a semiconductor substrate, and forming first doped impurity regions at sides of the gate electrode in the substrate;

forming a side wall spacer formation pattern, wherein the side wall spacer formation pattern includes an open portion at one or more sides of the gate electrode, wherein the side wall spacer formation pattern is not formed in the open portion;

forming an insulating layer in the open portion, wherein the insulating layer forms a side wall spacer at the side of the gate electrode in the open portion; and removing the side wall spacer formation pattern, and forming a second doped impurity region in the substrate beside the side wall spacer.

12. The process of claim 11, wherein the step of forming a side wall spacer formation pattern comprises forming a photoresist layer and patterning the photoresist layer to form the sidewall formation layer pattern.

13. The process of claim 11, wherein the step of forming an insulating layer in the open portion comprising forming the insulating layer and etching a portion of the insulating layer, wherein a portion of the insulating layer remains in the open portion.

14. The process of claim 11, wherein the insulating layer comprises an oxide layer formed by applying a low temperature chemical vapor deposition method.

15. The process of claim 14, wherein the oxide layer is formed by maintaining a process temperature below about 150° Celsius.

16. The process of claim 11, wherein the side wall spacer is formed without utilizing an anisotropic etch process.

17. The process of claim 13, wherein the insulating layer is etched by applying a wet etching method.

18. The process of claim 11, wherein an open portion is formed at first and second sides of the gate electrode, wherein first and second side wall spacers are formed in the open portions at the first and second sides of the gate electrode.

19. The process of claim 18, wherein the first and second side wall spacers have equal widths.

20. The process of claim 18, wherein the first and second side wall spacers have unequal widths.

* * * * *